(12) United States Patent
Han et al.

(10) Patent No.: US 12,713,554 B2
(45) Date of Patent: Aug. 18, 2026

(54) HEAT DISSIPATION CABINET AND HEAT DISSIPATION CABINET SYSTEM

(71) Applicant: HUAWEI TECHNOLOGIES CO., LTD., Shenzhen (CN)

(72) Inventors: Yunchao Han, Shanghai (CN); Bo Zhao, Shanghai (CN); Weifeng Hu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 283 days.

(21) Appl. No.: 18/628,991

(22) Filed: Apr. 8, 2024

(65) Prior Publication Data

US 2024/0260226 A1 Aug. 1, 2024

Related U.S. Application Data

(63) Continuation of application No. PCT/CN2022/123973, filed on Oct. 9, 2022.

(30) Foreign Application Priority Data

Oct. 9, 2021 (CN) .......................... 202111179972.8

(51) Int. Cl.
*H05K 7/20* (2006.01)

(52) U.S. Cl.
CPC ..... *H05K 7/20154* (2013.01); *H05K 7/20145* (2013.01)

(58) Field of Classification Search
CPC ....................... H05K 7/20154; H05K 7/20145
(Continued)

(56) References Cited

U.S. PATENT DOCUMENTS 2,824,939 A * 2/1958 Claybourn ............... H02B 1/56 218/51
4,600,050 A * 7/1986 Noren ................ F28D 15/0275 D23/370

(Continued)

FOREIGN PATENT DOCUMENTS

CN 102264212 A 11/2011
CN 101754647 B 3/2012

(Continued)

OTHER PUBLICATIONS

Extended European Search Report dated Dec. 4, 2024, issued for European Application No. 22877969.0 (8 pages).

*Primary Examiner* — Anatoly Vortman

(57) ABSTRACT

A cabinet is provided. The cabinet includes a housing, a heat generation device and a heat exchanger that are located in the housing and arranged along a first direction. The heat generation device has a device cavity, and the heat exchanger has a heat exchanger cavity. Along a second direction, an air-in cavity and an air-out cavity are respectively provided between two ends of the heat generation device and the housing. Along a third direction, a first cavity and a second cavity are respectively provided between two ends of the heat generation device and the housing. A third cavity and a fourth cavity are respectively provided between two ends of the heat exchanger and the housing. Airflow can flow through the device cavity, the air-out cavity, the first cavity, the third cavity, the heat exchanger cavity, and the fourth cavity, and enter the air-in cavity from the fourth cavity.

20 Claims, 2 Drawing Sheets

(58) Field of Classification Search
USPC .......................................................... 361/692
See application file for complete search history.

(56) References Cited

U.S. PATENT DOCUMENTS 4,699,208 A * 10/1987 Wolf .................. H05K 7/20918 165/47
4,797,783 A * 1/1989 Kohmoto ........... H05K 7/20572 361/688
4,949,218 A * 8/1990 Blanchard ............. H05K 7/206 165/122
5,806,583 A * 9/1998 Suzuki .................... F28F 1/126 165/104.34
5,823,248 A * 10/1998 Kadota ................. F25B 23/006 165/104.33
5,832,988 A * 11/1998 Mistry ................... H05K 7/206 165/104.34
6,164,369 A * 12/2000 Stoller ............... H05K 7/20572 165/104.34
6,459,579 B1 * 10/2002 Farmer ............. H05K 7/20736 361/679.48
6,504,717 B1 * 1/2003 Heard .................. H05K 7/2019 165/122
6,594,148 B1 * 7/2003 Nguyen ............. H05K 7/20581 361/695
6,704,198 B2 * 3/2004 Replogle ................ H05K 7/186 165/122
6,801,428 B2 * 10/2004 Smith .................. H05K 7/1488 361/679.48
6,819,563 B1 * 11/2004 Chu ................... H05K 7/20736 165/104.33
6,877,551 B2 * 4/2005 Stoller .................. H02B 1/565 165/47
6,889,752 B2 * 5/2005 Stoller ................... H05K 7/206 165/47
7,154,748 B2 * 12/2006 Yamada ............. H05K 7/20572 361/695
7,259,963 B2 * 8/2007 Germagian ........ H05K 7/20745 361/691
7,430,117 B2 * 9/2008 Shabany ............ H05K 7/20581 361/679.48
7,593,223 B2 * 9/2009 Kobayashi ................ G06F 1/20 361/679.5
7,604,535 B2 * 10/2009 Germagian ........ H05K 7/20745 454/184
7,701,712 B2 * 4/2010 Kramer ................. H10W 40/47 361/678
7,813,121 B2 * 10/2010 Bisson ............... H05K 7/20736 361/679.53
7,944,693 B2 * 5/2011 Kempf ............... H05K 7/20563 361/679.48
8,199,500 B2 * 6/2012 Yamagiwa ......... H05K 7/20127 165/104.34
8,223,492 B2 * 7/2012 Ji ....................... H05K 7/20572 361/679.48
8,325,478 B2 * 12/2012 Siracki ............... H05K 7/20918 361/679.48
8,503,178 B2 * 8/2013 Chen ...................... H05K 7/202 361/679.48
8,649,173 B2 * 2/2014 Kimura ............. H05K 7/20727 361/679.48
10,111,360 B2 * 10/2018 Perrin .................... H02B 1/565
10,451,295 B2 * 10/2019 James ..................... F24F 13/14
10,462,938 B2 * 10/2019 Wan ................... H05K 7/20181
10,952,353 B1 * 3/2021 Bean, Jr ............. H05K 7/20836
11,191,191 B2 * 11/2021 Krippner ............. H05K 7/2039
11,765,855 B2 * 9/2023 Suh .................... H05K 7/20181 361/695
2003/0231467 A1 12/2003 Replogle et al.
2007/0195499 A1 * 8/2007 Chu .......................... G06F 1/20 361/695
2007/0274039 A1 * 11/2007 Hamlin .............. H05K 7/20572 361/695
2010/0253189 A1 * 10/2010 Ji ....................... H05K 7/20572 312/236
2012/0181002 A1 * 7/2012 Chen ......................... F28F 7/02 165/121
2012/0199003 A1 * 8/2012 Melikov ................ G16H 50/80 454/192

FOREIGN PATENT DOCUMENTS

CN 202799422 U 3/2013
CN 103269569 A 8/2013
CN 204795998 U 11/2015
CN 206410580 U 8/2017

* cited by examiner

HEAT DISSIPATION CABINET AND HEAT DISSIPATION CABINET SYSTEM

CROSS-REFERENCE TO RELATED APPLICATIONS

This application is a continuation of International Application No. PCT/CN2022/123973, filed on Oct. 9, 2022, which claims priority to Chinese Patent Application No. 202111179972.8, filed on Oct. 9, 2021. The disclosures of the aforementioned applications are hereby incorporated by reference in their entireties.

TECHNICAL FIELD

This disclosure relates to the field of communication device technologies, and in particular, to a cabinet.

BACKGROUND

A 5G ultra-lean site generally has a cabinet. The cabinet can be used to distribute power to 5G devices or accommodate other devices. For example, the cabinet is used for power distribution. With the large-scale deployment of 5G ultra-lean sites and the improvement of communication performance, power distribution requirements of the 5G devices are greatly higher. In the future, a power distribution requirement of the market will reach 12,000 W, and corresponding heat consumption of a device will reach 800 W. However, a power distribution capability of an existing cabinet is 8,000 W, the corresponding heat consumption of a device is 400 W. The existing cabinet will fail to meet the requirement. The existing cabinet generally uses a heat exchanger for heat dissipation. An internal device fan drives internal circulation airflow to pass through an internal planar loop air passage, to perform heat exchange with external circulation airflow via a heat exchange core. However, the planar loop air passage causes low space utilization of the cabinet and poor airflow, resulting in a poor heat dissipation capability of the cabinet.

SUMMARY

This disclosure provides a cabinet. An internal circulation air passage of the cabinet is optimized, so that space utilization of the cabinet can be improved, and efficiency of internal circulation airflow can be improved. This resolves a problem in a conventional technology that a heat dissipation capability of the cabinet is poor.

An embodiment of this disclosure provides a cabinet. The cabinet includes:

a housing;

a heat generation device, where the heat generation device is located in the housing and has a device cavity;

a heat exchanger, where the heat exchanger is located in the housing and has a heat exchanger cavity; where the heat generation device and the heat exchanger are arranged along a first direction;

along a second direction, an air-in cavity and an air-out cavity are respectively provided between two ends of the heat generation device and the housing;

along a third direction, a first cavity and a second cavity are respectively provided between two ends of the heat generation device and the housing, and a third cavity and a fourth cavity are respectively provided between two ends of the heat exchanger and the housing;

after entering the air-in cavity, airflow flows through the device cavity, the air-out cavity, the first cavity, the third cavity, the heat exchanger cavity, and the fourth cavity, and enters the air-in cavity from the fourth cavity; and the heat exchanger is configured to perform heat exchange between external airflow and the airflow that enters the heat exchanger cavity through the third cavity.

In the foregoing solution, the air-in cavity, the air-out cavity, the first cavity, the second cavity, the third cavity, and the fourth cavity are disposed in a space defined inside the cabinet. This optimizes an internal circulation air passage, expands a flow range of airflow in the cabinet, and improves space utilization of the cabinet, so that the airflow sequentially flows through various spaces of the cavities. In addition, the airflow can move along the first direction and the third direction in one cycle. Therefore, a polydirectional internal circulation air passage is formed, and heat can be dissipated in a plurality of directions inside the cabinet, improving a heat dissipation capability of the cabinet.

In a possible implementation, the first cavity communicates with the third cavity, to form a first through cavity. The second cavity communicates with the fourth cavity, to form a second through cavity.

In the foregoing solution, the first cavity communicates with the third cavity, to reduce resistance stopping the airflow from flowing into the third cavity from the first cavity. In addition, a space of the first through cavity is larger than a space of the first cavity or the third cavity, so that an accommodating space and a flow space for the airflow become larger, and more airflow can enter the heat exchanger cavity for heat exchange with the external airflow. Similarly, a space of the second through cavity between the second cavity and the fourth cavity is larger than a space of the second cavity or the fourth cavity, so that an accommodating space and a flow space for the airflow become larger, and more airflow can enter the air-in cavity from the fourth cavity for a next cycle. This improves utilization of the airflow in both the first cavity and the fourth cavity.

In a possible implementation, the first cavity communicates with the third cavity through the air-out cavity, and the second cavity communicates with the fourth cavity.

In the foregoing solution, the air-out cavity communicates with the first cavity and the third cavity separately. One part of the airflow in the air-out cavity directly flows into the third cavity from the air-out cavity. The other part flows into the first cavity along the second direction, and then flows into the third cavity along the first direction. In this case, resistance stopping the airflow from flowing into the third cavity is less than resistance stopping the airflow from flowing into the third cavity along a single path. This facilitates flowing of the airflow into the third cavity from the air-out cavity. Similarly, the second cavity communicates with the fourth cavity. One part of the airflow in the fourth cavity can flow into the second cavity along the first direction, so that there is less airflow in the fourth cavity, and resistance stopping the airflow from flowing into the air-in cavity from the fourth cavity is reduced. This facilitates flowing of the airflow into the air-in cavity from the fourth cavity.

In a possible implementation, the airflow in the heat exchanger cavity can enter the fourth cavity and the second cavity, and enter the air-in cavity from the second cavity.

In the foregoing solution, the one part of the airflow in the fourth cavity flows into the second cavity along the first direction, and then flows into the air-in cavity along the second direction. The other part of the airflow directly flows into the air-in cavity from the fourth cavity. In this case, resistance stopping the airflow from flowing into the air-in cavity is less than resistance stopping the airflow from flowing into the air-in cavity along a single path. Therefore, more airflow can flow into the air-in cavity from the fourth cavity.

In a possible implementation, the cabinet further includes a partition plate located between the heat generation device and the heat exchanger.

In the foregoing solution, the partition plate is configured to separate the heat generation device and the heat exchanger. In addition, all end faces of the partition plate are connected to the housing, so that the air-in cavity, the air-out cavity, the first cavity, the second cavity, the third cavity, and the fourth cavity that are independent of each other are formed inside the cabinet. The space inside the cabinet is fully utilized, and the airflow sequentially flows through the various spaces of the cavities in the cabinet. This improves the space utilization of the cabinet.

In a possible implementation, the partition plate is provided with an interconnection opening, and the interconnection opening interconnects the fourth cavity to the air-in cavity.

When the cabinet is working, one part of the airflow can directly return to the air-in cavity, and the other part of the airflow can flow into the air-in cavity from the fourth cavity through the interconnection opening. The interconnection opening is provided, so that there is another path for the airflow to flow into the air-in cavity, the resistance stopping the airflow from flowing into the air-in cavity can be reduced, and the more airflow can flow into the air-in cavity. In addition, the airflow in the fourth cavity can flow into the air-in cavity along a shortest path, to perform the next cycle. This improves the utilization of the airflow in the fourth cavity, and further improves heat dissipation efficiency. In a possible implementation, the cabinet further includes an internal circulation fan, and the internal circulation fan is located at at least one end of the heat exchanger along the third direction.

In the foregoing solution, the internal circulation fan is located at the at least one end of the heat exchanger along the third direction, and can drive the airflow in the air-out cavity to flow into the third cavity. Then, the internal circulation fan drives the airflow in the third cavity to flow into the heat exchanger cavity, for perform heat exchange with the external airflow. Further, the internal circulation fan drives the airflow in the heat exchanger cavity to flow into the fourth cavity, and finally drive the airflow in the fourth cavity to flow into the air-in cavity. The internal circulation fan provides a driving force for the airflow, and can effectively drive the airflow inside the cabinet to flow. In this way, the airflow can sequentially flow through the various spaces of the cavities, the space utilization of the cabinet is improved, and resistance stopping the internal circulation airflow is reduced. This improves a flow velocity of the airflow, and further improves the heat dissipation efficiency when a shape and size of the cabinet remain unchanged.

In a possible implementation, the cabinet further includes a device fan. The device fan is disposed in the heat generation device and is configured to drive the airflow to flow into the air-out cavity from the air-in cavity.

In the foregoing solution, the device fan is located at at least one end of the heat generation device. The device fan can drive the airflow in the air-in cavity into the device cavity of the heat generation device, and can drive the airflow to pass through the device cavity along the second direction, so that the airflow flows into the air-out cavity from another end of the heat generation device. The device fan provides a specific driving force for the airflow, and facilitates flowing of the airflow. In this way, the airflow can absorb the heat generated by the heat generation device, and improve the heat dissipation efficiency.

In a possible implementation, a blocking member is disposed in the second cavity and the fourth cavity. The blocking member is configured to block the airflow from flowing toward the air-out cavity.

In the foregoing solution, the blocking member can block airflow can prevent the airflow from flowing to the air-out cavity, so that the airflow flows more to the air-in cavity. This improves the utilization of the airflow in both the second cavity and the fourth cavity.

In a possible implementation, the air-in cavity is provided with a return air vent and an air-in vent. When the cabinet is working, regardless of whether the partition plate is disposed or not, one part of the airflow from the heat exchanger cavity directly returns to the air-in cavity. The other part of the airflow enters the second through cavity, and returns to the air-in cavity through the return air vent. In other words, the airflow in both the second cavity and the fourth cavity can enter the air-in cavity through the return air vent, and the airflow in the air-in cavity can enter the device cavity through the air-in vent.

In the foregoing solution, the air-in vent and the return air vent are provided, so that a flow path of the airflow in the air-in cavity, the second cavity, and the fourth cavity can be shortened, and flow efficiency of the airflow can be improved.

In a possible implementation, one of the air-in cavity and the air-out cavity is located on a front side of the heat generation device, and the other is located on a rear side of the heat generation device.

In the foregoing solution, the air-in cavity and the air-out cavity are respectively disposed at the front end and the rear end of the heat generation device along the second direction, so that the airflow can fully absorb the heat of the heat generation device in the device cavity, improving the heat dissipation capability of the cabinet.

In a possible implementation, one of the first cavity and the second cavity is located on a top of the heat generation device, and the other is located on the bottom of the heat generation device. One of the third cavity and the fourth cavity is located on a top of the heat exchanger, and the other is located on a bottom of the heat exchanger. The first cavity and the third cavity are located on a same side, and the second cavity and the fourth cavity are located on a same side.

In the foregoing solution, the first cavity and the third cavity are located on the same side, and the second cavity and the fourth cavity are located on the same side. In this case, a flow path of the airflow from the first cavity to the third cavity, and a flow path of the airflow from the fourth cavity into the second cavity are shortest. This improves the flow efficiency of the airflow.

It should be understood that the foregoing general descriptions and the following detailed descriptions are merely used as an example, and should not limit this disclosure.

REFERENCE NUMERALS

1: housing;
11: air-in cavity;
111: return air vent;
112: air-in vent;
12: air-out cavity;
13: first cavity;
14: second cavity;
141: blocking member;
15: third cavity;
16: fourth cavity;
17: first through cavity;
18: second through cavity;
2: device cavity;
3: heat exchanger cavity;
4: partition plate;
41: interconnection opening;
5: internal circulation fan;
20: heat generation device;
30: heat exchanger;
X: first direction;
Y: second direction;
Z: third direction.

The accompanying drawings herein are incorporated into this specification and constitute a part of this specification, to show embodiments in accordance with this disclosure, and are used, together with this specification, to explain the principle of this disclosure.

DESCRIPTION OF EMBODIMENTS

To better understand technical solutions of this disclosure, the following describes embodiments of this disclosure in detail with reference to the accompanying drawings.

In a specific embodiment, the following further describes this disclosure in detail with reference to specific embodiments and the accompanying drawings.

An embodiment of this disclosure provides a cabinet. The cabinet is configured to accommodate a heat generation device. The heat generation device is a device that is placed in the cabinet and that generates heat when working. For example, the heat generation device may be a power supply device, and is configured to distribute power to an electrical device (for example, a 5G device like a 5G base station). The cabinet and heat generation device are collectively referred to as a cabinet system. The cabinet may be an outdoor cabinet or an indoor cabinet. The internal heat generation device includes, but is not limited to, a blade power supply, a communication device (for example, a communication board), a battery, and the like. In this embodiment of this disclosure, an example in which the cabinet system is a power supply cabinet (to be specific, the heat generation device placed in the cabinet is a power supply, for example, the blade power supply) with air flowing in at the front and exhausting at the rear of the heat generation device is used for description.

Figure 1:
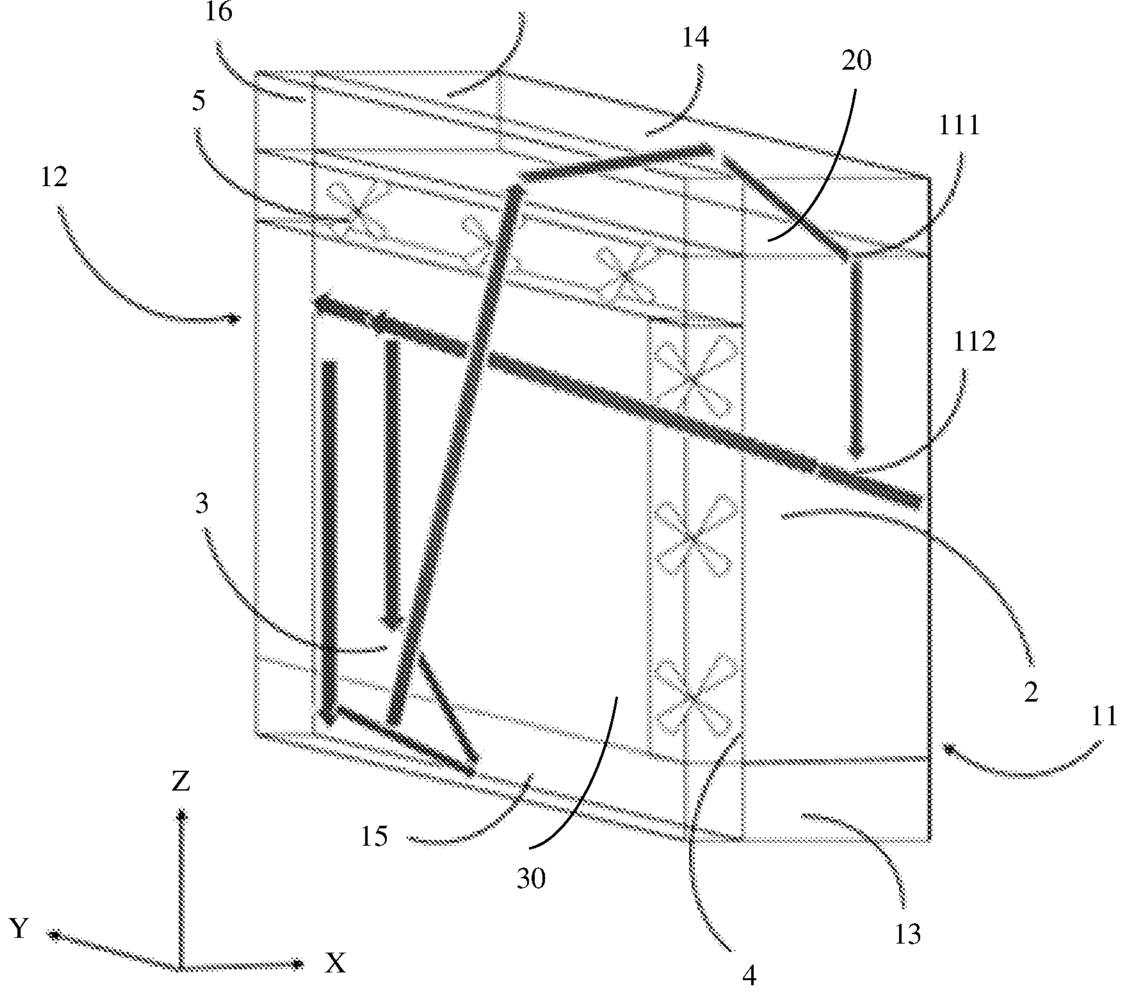
FIG. 1 is a schematic diagram of an airflow direction inside a cabinet according to an embodiment of this disclosure.

As shown in FIG. 1, a cabinet includes a housing 1, a heat generation device 20, and a heat exchanger 30. Both the heat generation device and the heat exchanger are located in the housing 1. The heat exchanger has a heat exchange core. The heat exchange core may be a downstream-flow heat exchange core, a counter-flow heat exchange core, or a cross-flow heat exchange core. In addition, when the heat exchange core works, a direction of a panel of the heat exchange core is not limited. The heat exchange core may rotate about a normal direction by any angle, so that the panel faces an inner side or an outer side of the cabinet. The heat generation device may be the device that generates heat when working in the cabinet. The solutions in this disclosure are used to perform heat dissipation for the heat generation device.

As shown in FIG. 1, the heat generation device has a device cavity 2, and the heat exchanger has a heat exchanger cavity 3. The device cavity 2 has a relatively high temperature, and the heat exchanger cavity 3 is configured for heat exchange by using a heat exchange medium. The heat generation device and the heat exchanger are arranged along a first direction X. Along a second direction Y, an air-in cavity 11 and an air-out cavity 12 are respectively provided between two ends of the heat generation device and the housing 1. Along a third direction Z, a first cavity 13 and a second cavity 14 are respectively provided between two ends of the heat generation device and the housing 1. A third cavity 15 and a fourth cavity 16 are respectively provided between two ends of the heat exchanger and the housing 1. After entering the air-in cavity 11, airflow can flow through the device cavity 2, the air-out cavity 12, the first cavity 13, the third cavity 15, the heat exchanger cavity 3, and the fourth cavity 16, and enter the air-in cavity 11 from the fourth cavity 16. The heat exchanger is configured to perform heat exchange between external airflow and the airflow that enters the heat exchanger cavity 3 through the third cavity 15.

When the cabinet is working, along the second direction Y, the airflow flows from the air-in cavity 11 into the device cavity 2 of the heat generation device, and then flows through the device cavity 2 into the air-out cavity 12. In addition, the airflow flowing in the device cavity 2 can absorb heat generated during running of the heat generation device, so that a running temperature of the heat generation device is reduced. The airflow that absorbs the heat of the heat generation device flows in the air-out cavity 12 along the third direction Z to one end that is of the air-out cavity 12 and that is connected to the first cavity 13, enters the first cavity 13, and flows in the first cavity 13 along the first direction X into the third cavity 15. In this case, the airflow in the third cavity 15 can flow into the heat exchanger cavity 3 of the heat exchanger along the third direction Z, for heat exchange in the heat exchanger cavity 3 with external cold airflow, to transfer the heat to the external cold airflow. The airflow after the heat exchange continues to flow in the heat exchanger cavity 3 along the third direction Z into the fourth cavity 16, and finally flows from the fourth cavity 16 into the air-in cavity 11. In this way, the airflow can flow into the device cavity 2 again for a next cycle.

In this embodiment, the air-in cavity 11, the air-out cavity 12, the first cavity 13, the second cavity 14, the third cavity 15, and the fourth cavity 16 are disposed in a space defined inside the cabinet. This optimizes an internal circulation air passage, expands a flow range of airflow in the cabinet, and improves space utilization of the cabinet, so that the airflow sequentially flows through various spaces of the cavities. In addition, the airflow can move along the first direction X and the third direction Z in one cycle. Therefore, a polydirectional internal circulation air passage is formed, and heat can be dissipated in a plurality of directions inside the cabinet, improving a heat dissipation capability of the cabinet.

The heat dissipation solution in this disclosure is mainly applicable to a cabinet with air flowing in at the front and exhausting at the rear of the heat generation device in the cabinet. Certainly, the heat dissipation solution in this disclosure may also be used for a cabinet with an internal heat generation device using another manner of air inlet and outlet.

It should be noted that airflow flowing along the first direction X does not mean that the airflow flows along the first direction X linearly in each cavity, but means that an overall flow direction of the airflow is from a first position to a second position. The first position and the second position are arranged along the first direction. A flow path of the airflow may be a path of any shape, for example, a curvy path or a linear path. Airflow flowing along the second direction Y and the third direction Z means the same as described above.

Figure 2:
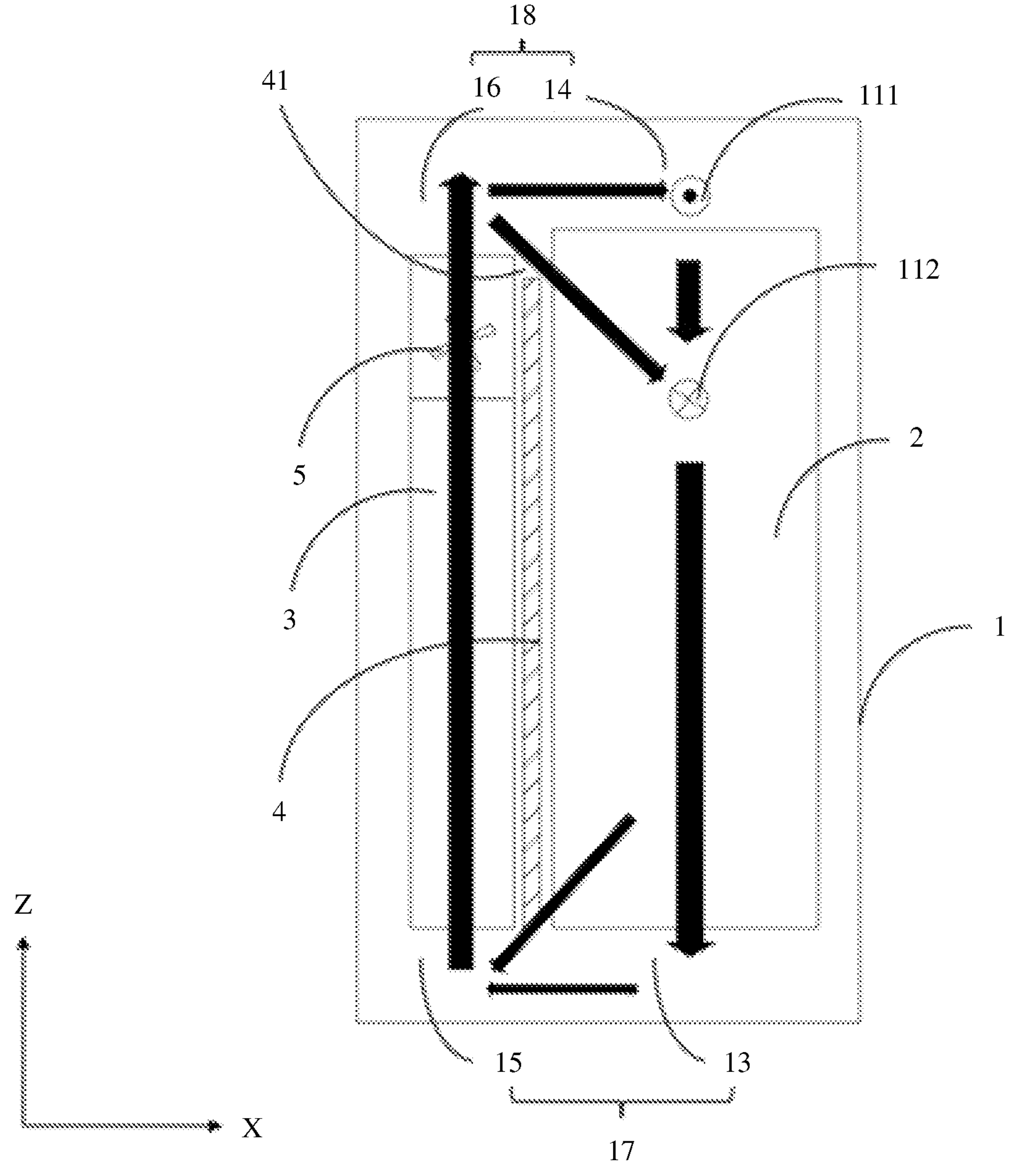
FIG. 2 is a schematic diagram of an airflow direction shown in FIG. 1 from another perspective.

In a specific embodiment, as shown in FIG. 2, the first cavity 13 communicates with the third cavity 15 to form a first through cavity 17. The second cavity 14 communicates with the fourth cavity 16 to form a second through cavity 18. To be specific, along the third direction Z, the first through cavity 17 and the second through cavity 18 are respectively provided between two ends of the heat generation device and the heat exchanger and the housing 1. In addition, in the first through cavity 17, a part located at one end of the heat generation device along the third direction Z is the first cavity 13, and a part located at one end of the heat exchanger along the third direction Z is the third cavity 15. In the second through cavity 18, a part located at the other end of the heat generation device along the third direction Z is the second cavity 14, and a part located at the other end of the heat exchanger along the third direction Z is the fourth cavity 16.

In this embodiment, the first cavity 13 communicates with the third cavity 15, to reduce resistance stopping the airflow from flowing into the third cavity 15 from the first cavity 13. In addition, a space of the first through cavity 17 formed is larger than a space of the first cavity 13 or the third cavity 15, so that an accommodating space and a flow space for the airflow become larger, and more airflow can enter the heat exchanger cavity 3 for heat exchange with the external airflow. Similarly, a space of the second through cavity 18 formed between the second cavity 14 and the fourth cavity 16 is larger than a space of the second cavity 14 or the fourth cavity 16, so that an accommodating space and a flow space for the airflow become larger, and more airflow can enter the air-in cavity 11 from the fourth cavity 16 for the next cycle. This improves utilization of the airflow in both the first cavity 13 and the fourth cavity 16.

In another specific embodiment, as shown in FIG. 1, the first cavity 13 communicates with the third cavity 15 through the air-out cavity 12, and the second cavity 14 communicates with the fourth cavity 16.

In this embodiment, the air-out cavity 12 communicates with the first cavity 13 and the third cavity 15 separately. One part of the airflow in the air-out cavity 12 directly flows into the third cavity 15 from the air-out cavity 12. The other part flows into the first cavity 13 along the second direction Y, and then flows into the third cavity 15 along the first direction X. In this case, resistance stopping the airflow from flowing into the third cavity 15 is less than resistance stopping the airflow from flowing into the third cavity 15 along a single path (all the airflow in the air-out cavity 12 directly flows into the third cavity 15, or all the airflow enters the first cavity 13 along the second direction Y and then flows into the third cavity 15 along the first direction X). This facilitates flowing of the airflow into the third cavity 15 from the air-out cavity 12. Similarly, the second cavity 14 communicates with the fourth cavity 16. One part of the airflow in the fourth cavity 16 can flow into the second cavity 14 along the first direction X, so that there is less airflow in the fourth cavity 16, and resistance stopping the airflow from flowing into the air-in cavity 11 from the fourth cavity 16 is reduced. This facilitates flowing of the airflow into the air-in cavity 11 from the fourth cavity 16.

Interconnection holes may be separately provided between the first cavity 13 and the air-out cavity 12 and between the third cavity 15 and the air-out cavity 12, to interconnect the first cavity 13 to the third cavity 15 through the air-out cavity 12. An interconnection hole may be provided between the second cavity 14 and the fourth cavity 16, to interconnect the second cavity 14 to the fourth cavity 16. A quantity, a shape, and a cross-sectional area of the interconnection holes may be specified based on an actual condition.

Specifically, as shown in FIG. 1, the airflow in the heat exchanger cavity 3 can enter the fourth cavity 16 and the second cavity 14, and enter the air-in cavity 11 from the second cavity 14.

In this embodiment, the airflow in the heat exchanger cavity 3 flows into the fourth cavity 16. The second cavity 14 communicates with the fourth cavity 16. One part of the airflow in the fourth cavity 16 flows into the second cavity 14 along the first direction X, and then flows into the air-in cavity 11 along the second direction Y. The other part of the airflow directly flows into the air-in cavity 11 from the fourth cavity 16. In this case, resistance stopping the airflow from flowing into the air-in cavity 11 is less than resistance stopping the airflow from flowing into the air-in cavity 11 along a single path (all the airflow in the fourth cavity 16 directly flows into the air-in cavity 11). Therefore, more airflow can flow into the air-in cavity 11 from the fourth cavity 16.

In a specific embodiment, as shown in FIG. 2, the cabinet further includes a partition plate 4 located between the heat generation device and the heat exchanger.

In this embodiment, the partition plate 4 is configured to separate the heat generation device and the heat exchanger. In addition, all end faces of the partition plate 4 are connected to the housing 1, so that the air-in cavity 11, the air-out cavity 12, the first cavity 13, the second cavity 14, the third cavity 15, and the fourth cavity 16 are independent of each other inside the cabinet. The space inside the cabinet is fully utilized, and the airflow sequentially flows through various spaces of the cavities in the cabinet. This improves the space utilization of the cabinet.

Specifically, as shown in FIG. 2, the partition plate 4 is provided with an interconnection opening 41. The interconnection opening 41 interconnects the fourth cavity 16 to the air-in cavity 11.

In this embodiment, when the cabinet is working, one part of the airflow can directly return to the air-in cavity 11, and the other part of the airflow can flow into the air-in cavity 11 from the fourth cavity 16 through the interconnection opening 41. The interconnection opening 41 is provided, so that there is another path for the airflow to flow into the air-in cavity 11, the resistance stopping the airflow from flowing into the air-in cavity 11 can be reduced, and more airflow can flow into the air-in cavity 11. In addition, the airflow in the fourth cavity 16 can flow into the air-in cavity 11 along a shortest path for the next cycle. This improves utilization of the airflow in the fourth cavity 16, and further improves heat dissipation efficiency.

In a specific embodiment, as shown in FIG. 1, the cabinet further includes an internal circulation fan 5. The internal circulation fan 5 is located at at least one end of the heat exchanger along the third direction Z.

In this embodiment, the internal circulation fan 5 is located at the at least one end of the heat exchanger along the third direction Z, and can drive the airflow in the air-out cavity 12 to flow into the third cavity 15. Then, the internal circulation fan 5 drives the airflow in the third cavity 15 to flow into the heat exchanger cavity 3, for heat exchange with the external airflow. Further, the internal circulation fan 5 drives the airflow in the heat exchanger cavity 3 to flow into the fourth cavity 16, and finally drives the airflow in the fourth cavity 16 to flow into the air-in cavity 11. The internal circulation fan 5 provides a driving force for the airflow, and can effectively drive the airflow inside the cabinet to flow. In this way, the airflow can sequentially flow through various spaces of the cavities, the space utilization of the cabinet is improved, and resistance stopping the internal circulation airflow is reduced. This improves a flow velocity of the airflow, and further improves the heat dissipation efficiency when a shape and size of the cabinet remain unchanged.

The internal circulation fan 5 may be located in any one space of the air-in cavity 11, the air-out cavity 12, the device cavity 2, the heat exchanger cavity 3, the first cavity 13, the second cavity 14, the third cavity 15, and the fourth cavity 16, and is configured to drive the airflow. As shown in FIG. 1, in this embodiment, the internal circulation fan 5 is located in the fourth cavity 16 connected to one end of the heat exchanger along the third direction Z.

Specifically, in this embodiment, the cabinet may include one internal circulation fan. The internal circulation fan 5 has an air-blowing function and an air-extracting function. When the airflow flows from the device cavity 2 into the air-out cavity 12, the internal circulation fan 5 can blow the airflow in the air-out cavity 12 to the first cavity 13, so that the airflow quickly flows into the first cavity 13 along the third direction Z. When the airflow flows from the first cavity 13 into the third cavity 15, the internal circulation fan 5 can extract the airflow in the third cavity 15 to the heat exchanger cavity 3, so that the airflow quickly flows into the heat exchanger cavity 3 along the third direction Z. Alternatively, the cabinet may include two internal circulation fans disposed side by side. Both the internal circulation fans 5 have the air-blowing function or the air-extracting function, and a corresponding internal circulation fan may be turned on or off based on a requirement, so that the airflow flows along a preset path.

In a specific embodiment, the cabinet further includes a device fan (not shown in the figure). The device fan is disposed in the heat generation device and is configured to drive the airflow to flow into the air-out cavity 12 from the air-in cavity 11.

In this embodiment, the device fan is located at at least one end of the heat generation device. The device fan can drive the airflow in the air-in cavity 11 into the device cavity 2 of the heat generation device, and can drive the airflow to pass through the device cavity 2 along the second direction Y, so that the airflow flows into the air-out cavity 12 from another end of the heat generation device. The device fan provides a specific driving force for the airflow, and facilitates flow of the airflow. In this way, the airflow can absorb the heat generated by the heat generation device, and improve the heat dissipation efficiency.

In a specific embodiment, as shown in FIG. 1, a blocking member 141 is disposed in the second cavity 14 and the fourth cavity 16. The blocking member 141 is configured to block the airflow from flowing toward the air-out cavity 12.

In this embodiment, the blocking member 141 is located at one end that is in both the second cavity 14 and the fourth cavity 16 and that is far away from the air-in cavity 11 and close to the air-out cavity 12. When the airflow entering both the second cavity 14 and the fourth cavity 16 flows into the air-out cavity 12 along the second direction Y, the blocking member 141 can prevent the airflow from continuing to flow toward the air-out cavity 12. In this case, the airflow changes a direction, and flows toward the air-in cavity 11. The blocking member 141 can prevent the airflow from flowing to the air-out cavity 12, so that the airflow flows more to the air-in cavity 11. This improves the utilization of the airflow in both the second cavity 14 and the fourth cavity 16.

The blocking member 141 may be specifically a metal baffle plate, foam, or another windproof structure.

In a specific embodiment, as shown in FIG. 2, the air-in cavity 11 is provided with a return air vent 111 and an air-in vent 112. When the cabinet is working, regardless of whether the partition plate 4 is disposed or not, one part of the airflow from the heat exchanger cavity 3 directly returns to the air-in cavity 11. The other part of the airflow enters the second through cavity 18, and returns to the air-in cavity 11 through the return air vent 111. In other words, the airflow in both the second cavity 14 and the fourth cavity 16 can enter the air-in cavity 11 through the return air vent 111, and the airflow in the air-in cavity 11 can enter the device cavity 2 through the air-in vent 112.

In this embodiment, the airflow in the air-in cavity 11 enters the device cavity 2 through the air-in vent 112. The airflow in both the second cavity 14 and the fourth cavity 16 returns to the air-in cavity 11 through the return air vent 111. Then, the airflow flows toward the air-in vent 112 along the third direction Z from the return air vent 111, and the next cycle of the airflow starts. The air-in vent 112 and the return air vent 111 are provided, so that a flow path of the airflow in the air-in cavity 11, the second cavity 14, and the fourth cavity 16 can be shortened, and flow efficiency of the airflow can be improved.

It should be noted that the cabinet in this disclosure may be in any shape. In the embodiments shown in FIG. 1 and FIG. 2, the cabinet may be of a cuboid structure. In the cabinet, both the heat exchanger and the heat generation device are of a vertical structure, and the heat exchanger and the heat generation device are arranged along a thickness direction of the cabinet. Based on this, in this embodiment, the first direction X may be specifically a width direction of the cabinet, the second direction Y may be specifically a length direction of the cabinet, and the third direction Z may be specifically a height direction of the cabinet. When the shape of the cabinet and arrangement directions of both the heat exchanger and the heat generation device are different, the first direction X, the second direction Y, and the third direction Z also change accordingly. When the cabinet is disposed based on an orientation shown in FIG. 1, a “front side” is a side facing a staff along the width direction (the first direction X), and a “rear side” is a side that is opposite to the staff along the width direction (the first direction X). A “left side” is a left side of the staff along the length direction (the second direction Y) when the staff faces the cabinet. A “right side” is a right side of the staff along the length direction (the second direction Y) when the staff faces the cabinet. A “top” is a top side of the cabinet, and a “bottom” is a bottom side of the cabinet. That is, the “top” and “bottom” that are two sides of the cabinet and that are opposite to each other along the height direction (the third direction Z).

In a specific embodiment, as shown in FIG. 1, one of the air-in cavity 11 and the air-out cavity 12 is located on a front side of the heat generation device, and the other is located on a rear side of the heat generation device. When the air-in cavity 11 is located on the front side of the heat generation device, the air-out cavity 12 is located on the rear side of the heat generation device. When the air-in cavity 11 is located on the rear side of the heat generation device, the air-out cavity 12 is located on the front side of the heat generation device.

In this embodiment, the air-in cavity 11 and the air-out cavity 12 communicate with the device cavity 2 of the heat generation device separately. The air-in cavity 11 can provide the airflow for the device cavity 2, so that the airflow flows into the device cavity 2 to absorb the heat generated by the heat generation device. The air-out cavity 12 can provide the space for the airflow that flows out of the device cavity 2, and guide the airflow to flow to a space of a next cavity. The air-in cavity 11 and the air-out cavity 12 are respectively disposed at the front end and the rear end of the heat generation device along the second direction Y, so that the airflow can fully absorb the heat of the heat generation device in the device cavity 2, improving the heat dissipation capability of the cabinet.

In a specific embodiment, as shown in FIG. 1, one of the first cavity 13 and the second cavity 14 is located on a top of the heat generation device, and the other is located on a bottom of the heat generation device. One of the third cavity 15 and the fourth cavity 16 is located on a top of the heat exchanger, and the other is located on a bottom of the heat exchanger. The first cavity 13 and the third cavity 15 are located on a same side, and the second cavity 14 and the fourth cavity 16 are located on a same side. When the first cavity 13 and the third cavity 15 are located on the top of the cabinet, the second cavity 14 and the fourth cavity 16 are located on the bottom of the cabinet. When the first cavity 13 and the third cavity 15 are located on the bottom of the cabinet, the second cavity 14 and the fourth cavity 16 are located on the top of the cabinet.

In this embodiment, the first cavity 13 and the second cavity 14 are respectively located at two ends of the heat generation device along the third direction Z. The third cavity 15 and the fourth cavity 16 are respectively located at two ends of the heat exchanger along the third direction Z. In this case, the flow range of airflow can be expanded, and the space utilization of the cabinet can be improved. In addition, when the third cavity 15 and the fourth cavity 16 are respectively located at the two ends of the heat exchanger, the airflow can pass through a longest path where the airflow flows into the heat exchanger cavity 3 of the heat exchanger from the third cavity 15, and then flows into the fourth cavity 16 from the heat exchanger cavity 3. Therefore, the airflow can perform heat exchange with the external airflow better. The first cavity 13 and the third cavity 15 are located on the same side, and the second cavity 14 and the fourth cavity 16 are located on the same side. In this case, a flow path of the airflow from the first cavity 13 to the third cavity 15, and a flow path of the airflow from the fourth cavity 16 into the second cavity 14 are shortest. This improves the flow efficiency of the airflow.

Specifically, as shown in FIG. 1 and FIG. 2, when a heat dissipation system of the cabinet in this embodiment of this disclosure works, the airflow flows into the device cavity 2 from the air-in cavity 11, absorbs the heat of the heat generation device, and flows into the air-out cavity 12 that is at the another end of the heat generation device along the second direction Y. Then, the airflow, driven by the internal circulation fan 5, flows into the first cavity 13 along the third direction, and then flows into the third cavity 15 that is on the same side as the first cavity 13. After the airflow in the third cavity 15 is driven by the internal circulation fan 5, the airflow flows into the heat exchanger cavity 3 along the third direction Z, and performs heat exchange with the external airflow in the heat exchanger cavity 3. The airflow after the heat exchange continues to flow, driven by the internal circulation fan 5, into the fourth cavity 16 that is at another end of the heat exchanger along the third direction Z, and then flows into the second cavity 14 that is on the same side as the fourth cavity 16. Finally, driven by the internal circulation fan 5, the airflow in the second cavity 14 flows back to the air-in cavity 11 for the next cycle.

What is claimed is:

1. A cabinet comprising:

a housing;

a heat generation device, wherein the heat generation device is located in the housing and has a device cavity; and a heat exchanger, wherein the heat exchanger is located in the housing and has a heat exchanger cavity, wherein the heat generation device and the heat exchanger are arranged along a first direction;

along a second direction, an air-in cavity is provided between an end of the heat generation device and the housing and an air-out cavity is provided between another end of the heat generation device and the housing;

along a third direction, a first cavity is provided between an end of the heat generation device and the housing and a second cavity is provided between another end of the heat generation device and the housing, and along the third direction, a third cavity is provided between the end of the heat generation device and the housing and a fourth cavity is provided between the another end of the heat exchanger and the housing;

after entering the air-in cavity, airflow flows through the device cavity, the air-out cavity, the first cavity, the third cavity, the heat exchanger cavity, and the fourth cavity, and enters the air-in cavity from the fourth cavity; and the heat exchanger performs heat exchange between external airflow and the airflow that enters the heat exchanger cavity through the third cavity.

2. The cabinet according to claim 1, wherein the first cavity communicates with the third cavity to form a first through cavity, and the second cavity communicates with the fourth cavity to form a second through cavity.

3. The cabinet according to claim 1, wherein the first cavity communicates with the third cavity through the air-out cavity, and the second cavity communicates with the fourth cavity.

4. The cabinet according to claim 3, wherein the airflow in the heat exchanger cavity enters the fourth cavity and the second cavity, and enters the air-in cavity from the second cavity.

5. The cabinet according to claim 1, wherein the cabinet further comprises a partition plate located between the heat generation device and the heat exchanger.

6. The cabinet according to claim 5, wherein the partition plate is provided with an interconnection opening, and the interconnection opening interconnects the fourth cavity to the air-in cavity.

7. The cabinet according to claim 1, wherein the cabinet further comprises an internal circulation fan, and the internal circulation fan is located at at least one end of the heat exchanger along the third direction.

8. The cabinet according to claim 1, wherein the cabinet further comprises a device fan, and the device fan is disposed in the heat generation device and drives the airflow to flow into the air-out cavity from the air-in cavity.

9. The cabinet according to claim 1, wherein a blocking member is disposed in the second cavity and the fourth cavity, and the blocking member blocks the airflow from flowing toward the air-out cavity.

10. The cabinet according to claim 9, wherein the air-in cavity is provided with a return air vent and an air-in vent, the airflow in the second cavity and the fourth cavity enters the air-in cavity through the return air vent, and the airflow in the air-in cavity enters the device cavity through the air-in vent.

11. The cabinet according to claim 1, wherein one of the air-in cavity or the air-out cavity is located on a front side of the heat generation device, and an other of the air-in cavity or the air-out cavity is located on a rear side of the heat generation device.

12. The cabinet according to claim 1, wherein one of the first cavity or the second cavity is located on a top of the heat generation device, and an other of first cavity or the second cavity is located on a bottom of the heat generation device;

one of the third cavity or the fourth cavity is located on a top of the heat exchanger, and an other of the third cavity or the fourth cavity is located on a bottom of the heat exchanger; and the first cavity and the third cavity are located on a same side, and the second cavity and the fourth cavity are located on a same side.

13. A cabinet system comprising: a cabinet and a heat generation device, wherein the heat generation device is located in the cabinet; and wherein the cabinet comprises:

a housing; and a heat exchanger, wherein the heat exchanger is located in the housing and has a heat exchanger cavity, wherein:

the heat generation device is located in the housing and has a device cavity;

the heat generation device and the heat exchanger are arranged along a first direction;

along a second direction, an air-in cavity is provided between an end of the heat generation device and the housing and an air-out cavity is provided between another end of the heat generation device and the housing;

along a third direction, a first cavity is provided between an end of the heat generation device and the housing and a second cavity is provided between another end of the heat generation device and the housing, and along the third direction, a third cavity is provided between the end of the heat generation device and the housing and a fourth cavity is provided between the another end of the heat exchanger and the housing;

after entering the air-in cavity, airflow flows through the device cavity, the air-out cavity, the first cavity, the third cavity, the heat exchanger cavity, and the fourth cavity, and enters the air-in cavity from the fourth cavity; and the heat exchanger performs heat exchange between external airflow and the airflow that enters the heat exchanger cavity through the third cavity.

14. The cabinet system according to claim 13, wherein the first cavity communicates with the third cavity to form a first through cavity, and the second cavity communicates with the fourth cavity to form a second through cavity.

15. The cabinet system according to claim 13, wherein the first cavity communicates with the third cavity through the air-out cavity, and the second cavity communicates with the fourth cavity.

16. The cabinet system according to claim 15, wherein the airflow in the heat exchanger cavity enters the fourth cavity and the second cavity, and enters the air-in cavity from the second cavity.

17. The cabinet system according to claim 13, wherein the cabinet further comprises a partition plate located between the heat generation device and the heat exchanger.

18. The cabinet system according to claim 17, wherein the partition plate is provided with an interconnection opening, and the interconnection opening interconnects the fourth cavity to the air-in cavity.

19. The cabinet system according to claim 13, wherein the cabinet further comprises an internal circulation fan, and the internal circulation fan is located at at least one end of the heat exchanger along the third direction.

20. The cabinet system according to claim 13, wherein the cabinet further comprises a device fan, and the device fan is disposed in the heat generation device and drives the airflow to flow into the air-out cavity from the air-in cavity.

* * * * *